(12) United States Patent
Johansson et al.

(10) Patent No.: US 8,003,232 B2
(45) Date of Patent: Aug. 23, 2011

(54) LAYERED COATED CUTTING TOOL

(75) Inventors: Mats Johansson, Linkoping (SE); Jon Andersson, Vasteras (SE); Jacob Sjolen, Fagersta (SE)

(73) Assignee: Seco Tools AB, Fagersta (SE)

( * ) Notice: Subject to any disclaimer, the term of this patent is extended or adjusted under 35 U.S.C. 154(b) by 124 days.

(21) Appl. No.: 12/399,597

(22) Filed: Mar. 6, 2009

(65) Prior Publication Data
US 2009/0226273 A1    Sep. 10, 2009

(30) Foreign Application Priority Data
Mar. 7, 2008   (SE) ...................................... 0800537

(51) Int. Cl.
*B32B 9/00*    (2006.01)
(52) U.S. Cl. ............ 428/697; 51/307; 51/309; 428/216; 428/336; 428/698
(58) Field of Classification Search ............ 51/307, 51/309; 428/216, 336, 697, 698, 699
See application file for complete search history.

(56) References Cited

U.S. PATENT DOCUMENTS

| | | | |
|---|---|---|---|
| 5,330,853 A | | 7/1994 | Hofmann et al. |
| 5,423,923 A | * | 6/1995 | Yamagata et al. ............ 428/627 |
| 5,503,912 A | | 4/1996 | Setoyama et al. |
| 6,077,596 A | | 6/2000 | Hashimoto et al. |
| 6,103,357 A | | 8/2000 | Selinder et al. |
| 6,254,984 B1 | | 7/2001 | Iyori |
| 6,309,738 B1 | | 10/2001 | Sakurai |
| 7,056,602 B2 | | 6/2006 | Horling et al. |
| 7,083,868 B2 | | 8/2006 | Horling et al. |
| 2006/0263582 A1 | * | 11/2006 | Flink et al. .................... 428/216 |
| 2006/0292399 A1 | * | 12/2006 | Sjolen et al. .................. 428/698 |

FOREIGN PATENT DOCUMENTS

| | | |
|---|---|---|
| EP | 0588350 B1 | 1/1997 |
| EP | 1736565 B1 | 12/2008 |
| WO | 2006118513 A1 | 11/2006 |

* cited by examiner

*Primary Examiner* — Archene Turner
(74) *Attorney, Agent, or Firm* — Young & Thompson

(57) ABSTRACT

Cutting tool inserts comprising a substrate selected from the group consisting of cemented carbide, cermet, ceramics, cubic boron nitride based material, and high speed steel; and a hard and wear-resistant coating comprising laminar polycrystalline metal nitrides layers are disclosed. Methods of making a cutting tool insert are also disclosed. In addition, methods for machining of stainless steel and super alloys using the cutting tool inserts are disclosed.

20 Claims, 2 Drawing Sheets

LAYERED COATED CUTTING TOOL

CROSS REFERENCE TO RELATED APPLICATIONS

This application claims priority to Swedish Application No. 0800537-3 filed Mar. 7, 2008, the entire disclosure of which is incorporated herein by reference.

FIELD OF THE INVENTION

This invention relates to tools for machining by chip removal. More specifically, the invention relates to layer coated cutting tool inserts comprising a body of a hard alloy of cemented carbide, cermet, ceramics, cubic boron nitride based material or high speed steel and a coating comprising laminar, cubic structured MeN where Me is one or more of the metal elements Ti, Nb, Hf, V, Ta, Zr, Cr, and Al, stabilizing the cubic phases of (Ti,Al)N and (Ti,Si)N. The coating is particularly useful in metal cutting applications generating high temperatures, such as machining of super alloys and stainless steel. The coating is grown by physical vapor deposition (PVD) and, preferably, by cathodic arc evaporation.

BACKGROUND OF THE INVENTION

TiN has been widely used as hard layer on cutting tools, but the poor oxidation resistance at temperatures above 500° C. has created an interest in ternary or quaternary compounds, e.g. Ti—Al—N and Ti—Cr—Al—N. More complex quaternaries, e.g. Ti—Al—Si—N, have been reported and described as super hard H>45 GPa due to a two phase structure consisting of crystalline phase of NaCl-type in combination with amorphous $Si_3N_4$ or $SiN_x$. These coating materials show an improved oxidation resistance and improved performance in machining of hardened steels.

EP 1736565, WO 2006/118513, and EP 0588350 disclose hard coatings comprising (Ti,Si)N layers.

U.S. Pat. No. 7,083,868 and U.S. Pat. No. 7,056,602 disclose hard coatings comprising (Ti,Al)N layers.

Coating optimization has also been obtained by applying different concepts of multilayer as: alternating Ti and Al containing layers (U.S. Pat. No. 6,309,738), oxygen and non-oxygen containing layers (U.S. Pat. No. 6,254,984), one of the layers stacked in the multilayer consists itself of a multilayer (U.S. Pat. No. 6,077,596), alternating nitrogen content (U.S. Pat. No. 5,330,853) or using one metastable compound (U.S. Pat. No. 5,503,912) or as aperiodic multilayer (U.S. Pat. No. 6,103,357).

The trends towards dry-work processes for environmental protection, i.e., metal cutting operation without using cutting fluids (lubricants) and accelerated machining speed with improved process, put even higher demands on the characteristics of the tool materials due to an increased tool cutting-edge temperature. In particular, coating stability at high temperatures, e.g. oxidation- and wear-resistance, have become even more crucial.

Surprisingly, it has been found that a coating comprising alternating cubic structured MeN, (Ti,Al)N and (Ti,Si)N layers leads to improved wear and temperature resistance.

What is needed is a coated cutting tool with improved high temperature performance during metal cutting. The invention is directed to these, as well as other, important needs.

SUMMARY OF THE INVENTION

Accordingly, the invention is directed to cutting tool inserts comprising a substrate of cemented carbide, cermet, ceramics, cubic boron nitride based material or high speed steel and on which at least on the functioning parts of the surface thereof, a hard and wear resistant coating is applied by cathodic arc evaporation. Said coating comprises laminar binary and ternary polycrystalline metal nitrides layers with a repetitive form A/B/A/C/A/B/A/C/ . . . with a total coating thickness of 0.5 to 5 µm. Layer A is MeN and where Me is one or more of the metal element Ti, Nb, Hf, V, Ta, Zr, Cr or Al. Layer B is $(Ti_{1-x}Al_x)N$, 0.3<x<0.95 and layer C is $(Ti_{1-y}Si_y)N$, 0.04<y<0.20. The average thickness of layer A ($d_A$) is about 2<$d_A$<about 100 nm, layer B ($d_B$) about 4 nm<$d_B$<about 150 nm, and layer C ($d_C$) about 4 nm<$d_C$<about 150 nm, essentially constant throughout the coating with a predominantly overall cubic coating structure.

In one embodiment, the invention is directed to cutting tool inserts, comprising:

a substrate selected from the group consisting of cemented carbide, cermet, ceramics, cubic boron nitride based material, and high speed steel; and a hard and wear-resistant coating comprising laminar polycrystalline metal nitrides layers;

wherein said laminar polycrystalline metal nitrides layers have a repetitive form . . . A/B/A/C/A/B/A/C/ . . . with a total thickness of about 0.5 µm to about 5 µm;

wherein layer A is a cubic structured MeN, and Me is one or more of the metal elements selected from the group consisting of Ti, Nb, Hf, V, Ta, Zr, Cr, and Al;

wherein layer B is a cubic structured (Ti,Al)N; and wherein layer C is a cubic structured (Ti,Si)N;

wherein the average composition of said laminar polycrystalline metal nitride layers is about 46 atomic share (at-%)<Zr+Hf+V+Cr+Nb+Ta+Ti+Al+Si<about 54 at-% and balance N;

wherein an average thickness of each of said layer A ($d_A$) is about 2 nm<$d_A$<about 100 nm;

wherein an average thickness of each of said layer B ($d_B$) is about 4 nm<$d_B$<about 150 nm; and wherein an average thickness of each of said layer C ($d_C$) is about 4 nm<$d_C$<about 150 nm; and wherein said average thickness of each of said layer A, said layer B, and layer C is substantially constant throughout said coating.

In other embodiments, the invention is directed to methods of making a cutting tool inserts described herein, said methods comprising the steps of:

growing each of said layers into said repetitive form . . . A/B/A/C/A/B/A/C/ . . . by cathodic arc evaporation to a total coating thickness of 0.5 to 5 µm with an evaporation current between about 50 A and about 200 A, in an atmosphere comprising a gas selected from the group consisting of Ar, $N_2$, and combinations thereof, at a total pressure between about 0.5 Pa and about 7.0 Pa, with a substrate bias between about −10 V and about −80 V, at a temperature between about 350° C. and about 700° C.;

wherein said layer A is grown using a pure or alloyed Me cathode;

wherein said layer B is grown using a Ti+Al-cathode with a composition between about (70 at % Ti+30 at % Al) and about (5 at % Ti+95 at % Al); and wherein said layer C is grown using a Ti+Si-cathode with a composition between about (95 at % Ti+5 at % Si) and about (75 at % Ti+25 at % Si).

In yet other embodiments, the invention is directed to methods of making a cutting tool for machining of stainless steel and super alloys, comprising the step of:

using a cutting tool insert described herein at a cutting speed of about 50-400 m/min, with an average feed, per tooth in the case of milling, of about 0.08-0.5 mm.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE INVENTION

According to the present invention, there is provided a cutting tool for machining by chip removal comprising a body of a hard alloy of cemented carbide, cermet, ceramics, cubic boron nitride based material or high speed steel onto which a wear resistant coating is deposited comprising alternating layers of cubic structured MeN where Me is one or more of the metal elements Ti, Nb, Hf, V, Ta, Zr, Cr, Al preferably Ti, Nb, Ta or Al, a cubic structured (Ti,Al)N layer and a cubic structured homogeneous (Ti,Si)N layer. The average composition of the coating is 46 at %<Zr+Hf+V+Cr+Nb+Ta+Ti+Al+Si<54 at % preferably 48 at %<Zr+Hf+V+Cr+Nb+Ta+Ti+Al+Si<52 at % and balanced N as determined by, e.g., EDS or WDS techniques.

Figure 1:
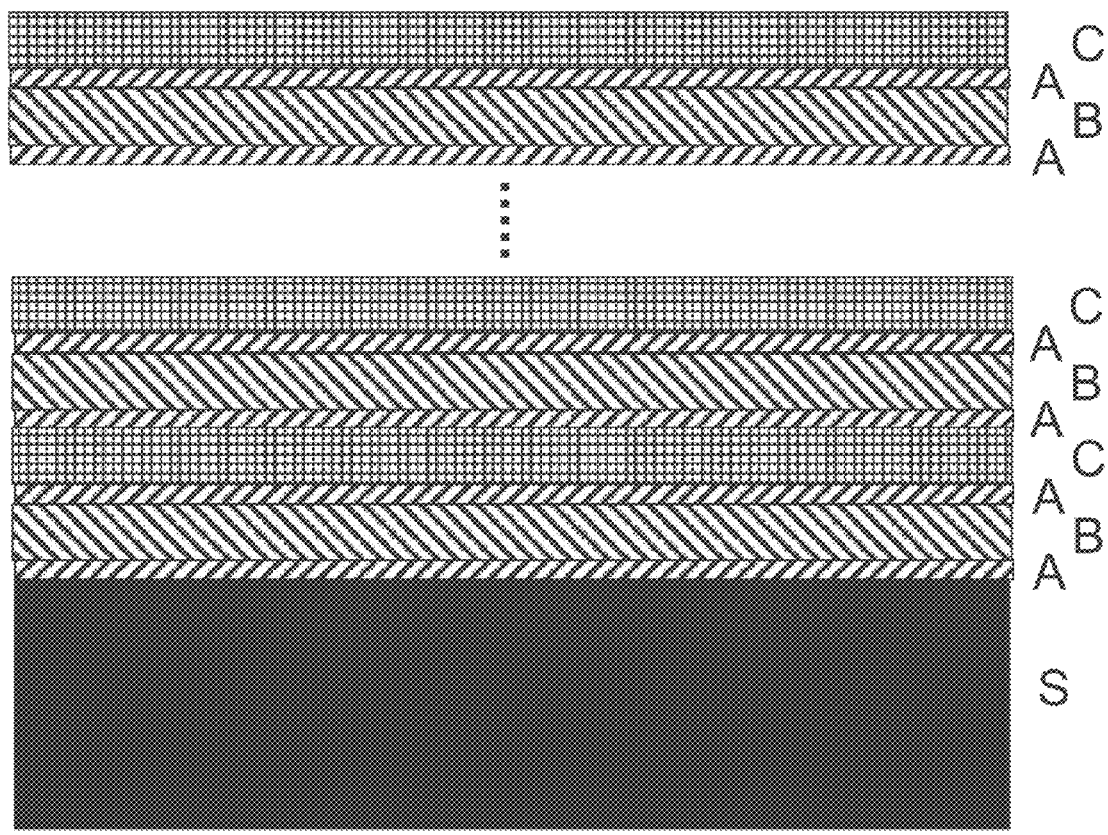
FIG. 1 is a schematic of the coating structure comprising (S) body, (A) layer A, (B) layer B and (C) layer C.

Said coating (see FIG. 1), comprises a laminar, layered . . . A/B/A/C/A/B/A/C/A/ . . . structure of polycrystalline metal nitrides layers, having a total thickness of about 0.5 to about 10 μm, preferably about 0.5 to about 5 μm, where layer A=MeN, layer B=$(Ti_{1-x}Al_x)N$, about 0.3<x<about 0.95, preferably about 0.45<x<about 0.75 and layer C=$(Ti_{1-y}Si_y)N$, about 0.04<y<about 0.20, preferably about 0.06<y<about 0.12. The average thickness of layer A ($d_A$) is about 2<$d_A$<about 100 nm, preferably about 2<$d_A$<about 25 nm, of layer B ($d_B$) about 4 nm<$d_B$<about 150 nm, preferably about 4 nm<$d_B$<about 50 nm and layer C ($d_C$) about 4 nm<$d_C$<about 150 nm, preferably about 4 nm<$d_C$<about 50 nm and essentially constant throughout the coating (some variation may occur for a three-fold rotation of the fixture).

Said body may be coated with an inner single- and/or multilayer coating of, e.g., TiN, TiC, Ti(C,N) or (Ti,Al)N, preferably (Ti,Al)N and/or an outer single- and/or multilayer coating of, e.g., TiN, TiC, Ti(C,N) or (Ti,Al)N, preferably (Ti,Al)N, to a total coating thickness, including the thickness of the laminar polycrystalline metal nitride layers results, of about 0.5 to about 20 μm, preferably about 1 to about 10 μm and most preferably about 2 to about 7 μm according to prior art.

The deposition method for the coatings of the present invention is based on cathodic arc evaporation of a pure or alloyed cathode under the following conditions; (Ti,Si)N layers are grown using Ti+Si-cathodes with a composition between (about 95 at % Ti+about 5 at % Si) and (about 75 at % Ti+about 25 at % Si), preferably between (about 95 at % Ti+about 5 at % Si) and (about 85 at % Ti+about 15 at % Si), (Ti,Al)N layers using Ti+Al-cathodes with a composition between (about 70 at % Ti+about 30 at % Al) and (about 5 at % Ti+about 95 at % Al), preferably between (about 40 at % Ti+about 60 at % Al) and (about 30 at % Ti+about 70 at % Al) and MeN layers using pure or alloyed Me-cathodes, where Me is one or more of the metal elements Ti, Nb, Hf, V, Ta, Zr, Cr, Al preferably one or more of Ti, Nb, Ta or Al. The evaporation current is between about 50 A and about 200 A depending on the cathode size and preferably between about 50 A and about 80 A using cathodes of about 63 mm in diameter. The layers are grown in an Ar+$N_2$ atmosphere, preferably in a pure $N_2$ atmosphere at a total pressure of about 0.5 Pa to about 7.0 Pa, preferably about 1.5 Pa to about 5.0 Pa. The bias is about −10 V to about −80 V, preferably about −30 V to about −60 V. The deposition temperature is between about 350° C. and about 700° C., preferably between about 400° C. and about 650° C.

The invention also relates to the use of cutting tool inserts according to the above for cutting applications generating high temperatures, e.g., machining of stainless steel and super alloys at cutting speeds of about 50-400 m/min, preferably about 75-300 m/min, with an average feed, per tooth in the case of milling, of about 0.08-0.5 mm, preferably about 0.1-0.4 mm depending on cutting speed and insert geometry.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described. All publications mentioned hereunder are incorporated herein by reference. Unless mentioned otherwise, the techniques employed or contemplated herein are standard methodologies well known to one of ordinary skill in the art. The materials, methods, and examples are illustrative only and not limiting.

The present invention is further defined in the following Examples, in which all parts and percentages are by weight and degrees are Celsius, unless otherwise stated. It should be understood that these examples, while indicating preferred embodiments of the invention, are given by way of illustration only. From the above discussion and these examples, one skilled in the art can ascertain the essential characteristics of this invention, and without departing from the spirit and scope thereof, can make various changes and modifications of the invention to adapt it to various usages and conditions.

EXAMPLES

Example 1

Cemented carbide inserts with composition 94 wt % WC-6 wt % Co (WC grain size of 0.8 μm) were used.

Figure 2A:
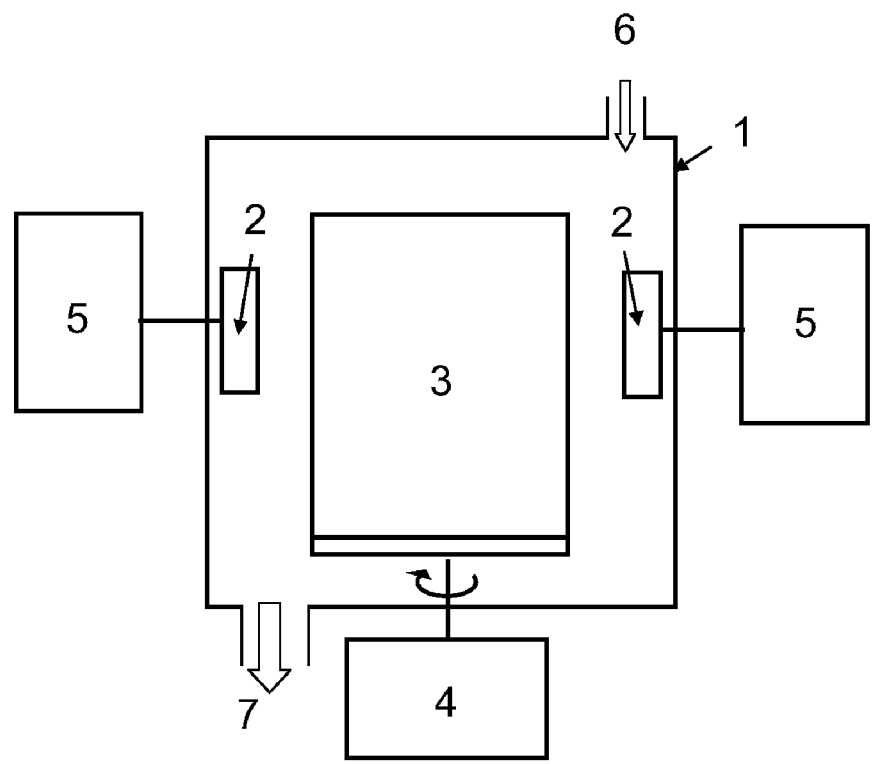
FIG. 2A is a schematic side view of the deposition chamber: (1) vacuum chamber, (2) cathode, (3) fixture, (4) power supply for biasing, (5) cathodic arc power supply, (6) inlet for process gas and (7) outlet for vacuum pump.
Figure 2B:
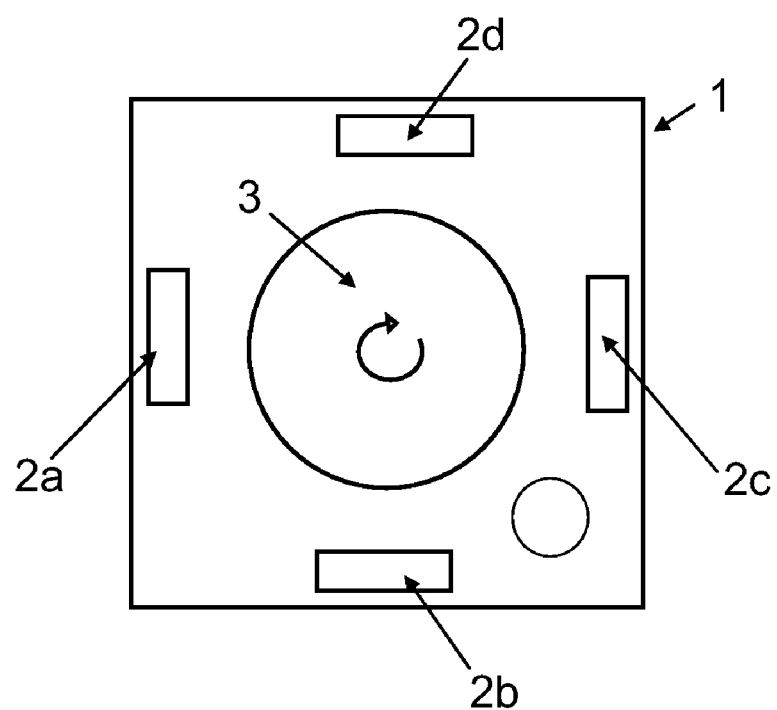
FIG. 2B is a schematic top view of the deposition chamber: (1) vacuum chamber, (2a) cathode position 1, (2b) cathode position 2, (2c) cathode position 3, (2d) cathode position 4 and (3) fixture.

Before deposition, the inserts were cleaned in ultrasonic baths of an alkali solution and alcohol. The system was evacuated to a pressure of less than $2.0 \times 10^{-3}$ Pa, after which the inserts were sputter cleaned with Ar ions. Alternating TiN/$(Ti_{0.34}Al_{0.66})$N/TiN/$(Ti_{0.91}Si_{0.09})$N/TiN . . . layers were grown by cathodic arc evaporation in pure $N_2$ atmosphere at a total pressure of 4 Pa using pure Ti-cathodes (position 2a and 2c in FIG. 2B), a 33 at % Ti+67 at % Al cathode (position 2b in FIG. 2B) and a 90 at % Ti+10 at % Si cathode (position 2d FIG. 2B), 63 mm in diameter for TiN, $(Ti_{0.34}Al_{0.66})$N and $(Ti_{0.91}Si_{0.09})$N, respectively. The layers were deposited at 500° C. using a bias of −40 V to a coating thickness of 3 μm. The thickness of the individual layers for different coatings (see Table 1) was controlled by altering the rotational speed of the fixture between 1 and 10 rpm and the evaporation current to the cathodes between 50 and 100 A.

The average composition of the coatings was estimated by energy dispersive spectroscopy (EDS) analysis area using a LEO Ultra 55 scanning electron microscope with a Thermo Noran EDS detector operating at 10 kV. The data were evaluated using a Noran System Six (NSS ver 2) software (see Table 1).

TABLE 1

| A (nm) | B (nm) | C (nm) | D (nm) | Si (at %) | Ti (at %) | Al (at %) | N (at %) |
|---|---|---|---|---|---|---|---|
| 60 | 120 | 58 | 298 | 1.8 | 35.8 | 13.1 | 49.4 |
| 59 | 121 | 96 | 336 | 2.6 | 36.2 | 11.8 | 49.5 |
| 60 | 118 | 120 | 358 | 3.0 | 36.8 | 10.8 | 49.4 |
| 18 | 40 | 20 | 98 | 1.8 | 34.5 | 13.3 | 50.4 |
| 20 | 41 | 32 | 113 | 2.5 | 36.2 | 11.9 | 49.4 |
| 19 | 41 | 40 | 120 | 3.0 | 36.1 | 11.2 | 49.8 |
| 12 | 24 | 12 | 60 | 1.8 | 35.8 | 13.1 | 49.4 |
| 12 | 24 | 19 | 67 | 2.6 | 36.4 | 11.7 | 49.4 |
| 11 | 23 | 24 | 70 | 3.1 | 36.1 | 10.8 | 50.1 |

TABLE 1-continued

| A (nm) | B (nm) | C (nm) | D (nm) | Si (at %) | Ti (at %) | Al (at %) | N (at %) |
|---|---|---|---|---|---|---|---|
| 2 | 4 | 2 | 10 | 1.8 | 35.8 | 13.1 | 49.4 |
| 2 | 5 | 3 | 12 | 2.3 | 34.8 | 13.6 | 49.4 |
| 2 | 4 | 5 | 13 | 3.5 | 37.1 | 10.1 | 49.4 |

Example 2

Experiment 1 was repeated replacing the Ti cathode for layer A (FIG. 1) with a pure Ta cathode.

The average composition of the coatings was estimated by energy dispersive spectroscopy (EDS) analysis (see Example 1) and summarized in Table 2.

TABLE 2

| A (nm) | B (nm) | C (nm) | D (nm) | Si (at %) | Ti (at %) | Ta (at %) | Al (at %) | N (at %) |
|---|---|---|---|---|---|---|---|---|
| 58 | 119 | 60 | 297 | 1.6 | 15.7 | 19.8 | 12.9 | 49.9 |
| 59 | 120 | 97 | 336 | 2.3 | 18.6 | 17.9 | 11.5 | 49.7 |
| 59 | 119 | 119 | 357 | 2.7 | 20.0 | 16.8 | 10.8 | 49.7 |
| 19 | 40 | 20 | 99 | 1.6 | 15.8 | 19.5 | 13.0 | 50.1 |
| 21 | 40 | 32 | 113 | 2.3 | 18.3 | 18.9 | 11.4 | 49.2 |
| 19 | 41 | 41 | 121 | 2.7 | 20.3 | 16.0 | 10.9 | 50.0 |
| 12 | 25 | 12 | 61 | 1.6 | 15.6 | 20.0 | 13.2 | 49.6 |
| 11 | 23 | 18 | 64 | 2.3 | 18.3 | 17.5 | 11.6 | 50.4 |
| 11 | 24 | 24 | 71 | 2.7 | 20.3 | 15.8 | 10.9 | 50.3 |
| 2 | 5 | 2 | 11 | 1.5 | 15.8 | 18.5 | 14.6 | 49.6 |
| 2 | 5 | 3 | 13 | 2.0 | 18.0 | 17.0 | 13.4 | 49.6 |
| 2 | 4 | 5 | 13 | 3.1 | 21.7 | 15.7 | 9.9 | 49.6 |

Example 3

Experiment 1 was repeated replacing the Ti cathode for layer A (FIG. 1) with a pure Zr cathode.

The average composition of the coatings was estimated by energy dispersive spectroscopy (EDS) analysis (see Example 1) and summarized in Table 3.

TABLE 3

| A (nm) | B (nm) | C (nm) | D (nm) | Si (at %) | Ti (at %) | Zr (at %) | Al (at %) | N (at %) |
|---|---|---|---|---|---|---|---|---|
| 59 | 118 | 59 | 297 | 1.6 | 15.5 | 20.2 | 12.9 | 49.8 |
| 61 | 118 | 100 | 340 | 2.4 | 18.7 | 18.3 | 11.2 | 49.5 |
| 60 | 120 | 120 | 350 | 2.7 | 20.0 | 17.0 | 10.8 | 49.6 |
| 20 | 39 | 19 | 99 | 1.6 | 15.3 | 20.7 | 12.8 | 49.6 |
| 21 | 39 | 31 | 111 | 2.2 | 18.1 | 19.2 | 11.3 | 49.1 |
| 19 | 40 | 40 | 121 | 2.7 | 20.2 | 16.3 | 10.9 | 50.0 |
| 11 | 25 | 14 | 60 | 1.8 | 16.7 | 18.0 | 13.0 | 50.4 |
| 12 | 24 | 29 | 64 | 3.0 | 21.4 | 15.9 | 10.1 | 49.6 |
| 11 | 24 | 25 | 71 | 2.8 | 20.6 | 15.6 | 10.8 | 50.3 |
| 2 | 4 | 2 | 12 | 1.6 | 15.6 | 20.3 | 12.9 | 49.6 |
| 2 | 5 | 3 | 13 | 2.0 | 18.0 | 17.0 | 13.4 | 49.6 |
| 2 | 5 | 6 | 13 | 3.2 | 22.8 | 13.6 | 10.8 | 49.6 |

Example 4

Experiment 1 was repeated replacing the Ti cathode for layer A (FIG. 1) with a pure Nb cathode.

The average composition of the coatings was estimated by energy dispersive spectroscopy (EDS) analysis (see Example 1) and summarized in Table 4.

TABLE 4

| A (nm) | B (nm) | C (nm) | D (nm) | Si (at %) | Ti (at %) | Nb (at %) | Al (at %) | N (at %) |
|---|---|---|---|---|---|---|---|---|
| 59 | 120 | 58 | 297 | 1.6 | 16.3 | 21.0 | 12.2 | 49.0 |
| 59 | 119 | 97 | 334 | 2.3 | 19.3 | 18.6 | 10.8 | 49.0 |
| 57 | 118 | 119 | 357 | 2.7 | 20.8 | 17.0 | 10.1 | 49.4 |
| 19 | 40 | 19 | 100 | 1.6 | 16.3 | 20.5 | 12.3 | 49.3 |
| 21 | 42 | 31 | 113 | 2.2 | 18.8 | 19.5 | 11.2 | 48.4 |
| 20 | 41 | 40 | 122 | 2.6 | 20.7 | 17.5 | 10.3 | 48.9 |
| 12 | 25 | 12 | 61 | 1.6 | 16.5 | 20.8 | 12.4 | 48.8 |
| 13 | 23 | 17 | 63 | 2.1 | 18.1 | 21.1 | 10.7 | 48.0 |
| 12 | 24 | 24 | 71 | 2.7 | 20.7 | 17.6 | 10.1 | 48.9 |
| 2 | 4 | 2 | 11 | 1.6 | 16.4 | 21.1 | 12.1 | 48.8 |
| 2 | 5 | 4 | 12 | 2.5 | 20.6 | 16.3 | 11.6 | 49.0 |
| 2 | 4 | 5 | 13 | 3.1 | 22.3 | 16.3 | 9.3 | 49.0 |

Example 5

Experiment 1 was repeated replacing the Ti cathode for layer A (FIG. 1) with a pure Nb cathode.

The average composition of the coatings was estimated by energy dispersive spectroscopy (EDS) analysis (see Example 1) and summarized in Table 5.

TABLE 5

| A (nm) | B (nm) | C (nm) | D (nm) | Si (at %) | Ti (at %) | Al (at %) | N (at %) |
|---|---|---|---|---|---|---|---|
| 58 | 120 | 60 | 300 | 1.6 | 15.7 | 32.7 | 49.9 |
| 60 | 118 | 95 | 335 | 2.3 | 18.4 | 29.8 | 49.6 |
| 59 | 119 | 120 | 357 | 2.7 | 20.1 | 27.5 | 49.7 |
| 20 | 42 | 20 | 100 | 1.6 | 15.6 | 33.2 | 49.6 |
| 21 | 40 | 32 | 113 | 2.3 | 18.3 | 30.3 | 49.2 |
| 19 | 42 | 42 | 121 | 2.7 | 20.5 | 26.8 | 50.0 |
| 11 | 23 | 10 | 62 | 1.4 | 14.9 | 33.2 | 50.5 |
| 10 | 25 | 18 | 64 | 2.2 | 18.6 | 28.1 | 51.1 |
| 11 | 24 | 24 | 72 | 2.7 | 20.3 | 26.7 | 50.3 |
| 2 | 4 | 2 | 9 | 1.6 | 15.6 | 33.2 | 49.6 |
| 2 | 5 | 4 | 12 | 2.5 | 19.8 | 28.1 | 49.6 |
| 2 | 4 | 5 | 13 | 3.1 | 21.7 | 25.6 | 49.6 |

Example 6

Experiment 1 was repeated replacing the Ti cathode for layer A (FIG. 1) with a Ti+Nb (95 at % Ti+5 at % Nb) cathode.

The average composition of the coatings was estimated by energy dispersive spectroscopy (EDS) analysis (see Example 1) and summarized in Table 6.

TABLE 6

| A (nm) | B (nm) | C (nm) | D (nm) | Si (at %) | Ti (at %) | Nb (at %) | Al (at %) | N (at %) |
|---|---|---|---|---|---|---|---|---|
| 60 | 119 | 60 | 299 | 2.0 | 34.3 | 1.2 | 12.8 | 49.7 |
| 60 | 120 | 97 | 337 | 2.9 | 34.9 | 1.1 | 11.5 | 49.7 |
| 58 | 119 | 119 | 356 | 3.3 | 34.9 | 1.0 | 10.8 | 50.0 |
| 20 | 40 | 20 | 100 | 2.0 | 34.2 | 1.2 | 12.9 | 49.7 |
| 21 | 40 | 32 | 113 | 2.8 | 35.4 | 1.1 | 11.4 | 49.3 |
| 20 | 41 | 41 | 122 | 3.4 | 35.1 | 1.0 | 10.9 | 49.7 |
| 12 | 25 | 12 | 61 | 2.0 | 33.9 | 1.2 | 13.2 | 49.7 |
| 12 | 23 | 18 | 65 | 2.8 | 35.0 | 1.1 | 11.4 | 49.7 |
| 12 | 24 | 24 | 72 | 3.3 | 35.2 | 1.0 | 10.8 | 49.7 |
| 2 | 5 | 2 | 11 | 1.8 | 32.7 | 1.1 | 14.6 | 49.7 |
| 2 | 5 | 3 | 12 | 2.5 | 33.4 | 1.0 | 13.4 | 49.7 |
| 2 | 4 | 5 | 13 | 3.8 | 35.6 | 0.9 | 9.9 | 49.7 |

Example 7

Experiment 1 was repeated replacing the Ti cathode for layer A (FIG. 1) with a Ti+Zr (70 at % Ti+30 at % Zr) cathode.

The average composition of the coatings was estimated by energy dispersive spectroscopy (EDS) analysis (see Example 1) and summarized in Table 7.

TABLE 7

| A (nm) | B (nm) | C (nm) | D (nm) | Si (at %) | Ti (at %) | Zr (at %) | Al (at %) | N (at %) |
|---|---|---|---|---|---|---|---|---|
| 58 | 119 | 59 | 300 | 2.0 | 29.9 | 5.1 | 13.0 | 50.0 |
| 58 | 121 | 100 | 339 | 2.9 | 31.1 | 4.4 | 11.5 | 50.0 |
| 59 | 120 | 120 | 350 | 3.3 | 31.7 | 4.3 | 10.8 | 49.8 |
| 22 | 39 | 19 | 98 | 1.9 | 31.1 | 5.7 | 12.6 | 48.7 |
| 20 | 38 | 34 | 111 | 3.0 | 31.7 | 4.6 | 11.0 | 49.7 |
| 21 | 41 | 42 | 126 | 3.4 | 32.2 | 4.4 | 10.7 | 49.3 |
| 11 | 26 | 12 | 61 | 2.0 | 29.1 | 4.7 | 13.7 | 50.5 |

TABLE 7-continued

| A (nm) | B (nm) | C (nm) | D (nm) | Si (at %) | Ti (at %) | Zr (at %) | Al (at %) | N (at %) |
|---|---|---|---|---|---|---|---|---|
| 12 | 24 | 19 | 65 | 2.8 | 31.2 | 4.7 | 11.6 | 49.7 |
| 13 | 25 | 25 | 75 | 3.3 | 32.4 | 4.5 | 10.8 | 49.0 |
| 2 | 4 | 2 | 11 | 2.0 | 30.2 | 5.2 | 12.9 | 49.7 |
| 2 | 4 | 4 | 12 | 3.3 | 31.9 | 4.3 | 10.8 | 49.7 |
| 2 | 4 | 5 | 11 | 3.8 | 32.5 | 4.0 | 9.9 | 49.7 |

Example 8

Reference: A layer of 3.0 μm $Ti_{0.34}Al_{0.66}N$ was deposited cemented carbide inserts with the composition 94 wt % WC-6 wt % Co (WC grain size of 0.8 μm), according to prior art.

Example 9

Inserts from Example 1 were tested in stainless steel according to:

| | |
|---|---|
| Geometry: | CNMG120408-MF1 |
| Application: | Continuous turning |
| Work piece material: | AISI 316L |
| Cutting speed: | 230 m/min |
| Feed: | 0.15 mm/rev |
| Depth of cut: | 1 mm |
| Tool life criteria, flank wear (vb) | >0.3 mm |

Results of Test

TABLE 8

| A (nm) | B (nm) | C (nm) | D (nm) | Tool life (min) |
|---|---|---|---|---|
| 60 | 120 | 58 | 298 | 18.7 |
| 59 | 121 | 96 | 336 | 18.3 |
| 60 | 118 | 120 | 358 | 18.6 |
| 18 | 40 | 20 | 98 | 19.5 |
| 20 | 41 | 32 | 113 | 19.9 |
| 19 | 41 | 40 | 120 | 20.2 |
| 12 | 24 | 12 | 60 | 21.8 |
| 12 | 24 | 19 | 67 | 21.9 |
| 11 | 23 | 24 | 70 | 22.4 |
| 2 | 4 | 2 | 10 | 17.3 |
| 2 | 5 | 3 | 12 | 17.5 |
| 2 | 4 | 5 | 13 | 17.8 |
| Reference | | | | 16.8 |

Example 10

Inserts from example 1 were tested in super alloy according to:

| | |
|---|---|
| Geometry: | CNMG120412-MR3 |
| Application: | Continuous turning |
| Work piece material: | Inconel 718 |
| Cutting speed: | 90 m/min |
| Feed: | 0.2 mm/rev |
| Depth of cut: | 0.5 mm |
| Tool life criteria, flank wear (vb) | >0.2 mm |

Results of Test

TABLE 9

| A (nm) | B (nm) | C (nm) | D (nm) | Tool life (min) |
|---|---|---|---|---|
| 60 | 120 | 58 | 298 | 11.1 |
| 59 | 121 | 96 | 336 | 11 |
| 60 | 118 | 120 | 358 | 11.3 |
| 18 | 40 | 20 | 98 | 11.7 |
| 20 | 41 | 32 | 113 | 11.7 |
| 19 | 41 | 40 | 120 | 11.8 |
| 12 | 24 | 12 | 60 | 12.1 |
| 12 | 24 | 19 | 67 | 12.5 |
| 11 | 23 | 24 | 70 | 12.6 |
| 2 | 4 | 2 | 10 | 10.1 |
| 2 | 5 | 3 | 12 | 10.4 |
| 2 | 4 | 5 | 13 | 10.6 |
| Reference | | | | 9.8 |

When ranges are used herein for physical properties, such as molecular weight, or chemical properties, such as chemical formulae, all combinations and subcombinations of ranges specific embodiments therein are intended to be included.

The disclosures of each patent, patent application, and publication cited or described in this document are hereby incorporated herein by reference, in their entirety.

Those skilled in the art will appreciate that numerous changes and modifications can be made to the preferred embodiments of the invention and that such changes and modifications can be made without departing from the spirit of the invention. It is, therefore, intended that the appended claims cover all such equivalent variations as fall within the true spirit and scope of the invention.

What is claimed is:

1. A cutting tool insert, comprising:
    a substrate selected from the group consisting of cemented carbide, cermet, ceramics, cubic boron nitride based material, and high speed steel; and
    a hard and wear-resistant coating comprising laminar polycrystalline metal nitrides layers;
    wherein said laminar polycrystalline metal nitrides layers have a repetitive form
    . . . A/B/A/C/A/B/A/C/ . . . with a total thickness of about 0.5 μm to about 5 μm;
    wherein layer A is a cubic structured MeN, and Me is one or more of the metal elements selected from the group consisting of Ti, Nb, Hf, V, Ta, Zr, Cr, and Al;
    wherein layer B is a cubic structured (Ti,Al)N; and
    wherein layer C is a cubic structured (Ti,Si)N;
    wherein the average composition of said laminar polycrystalline metal nitride layers is about 46 atomic share (at-%)<Zr+Hf+V+Cr+Nb+Ta+Ti+Al+Si<about 54 at-% and balance N;
    wherein an average thickness of each of said layer A ($d_A$) is about 2 nm<$d_A$<about 100 nm;
    wherein an average thickness of each of said layer B ($d_B$) is about 4 nm<$d_B$<about 150 nm; and
    wherein an average thickness of each of said layer C ($d_C$) is about 4 nm<$d_C$<about 150 nm; and wherein said average thickness of each of said layer A, said layer B, and layer C is substantially constant throughout said coating.

2. A cutting tool insert according to claim 1,
wherein the average composition of said laminar polycrystalline metal nitride layers is about 48 at-% < Zr+Hf+V+Cr+Nb+Ta+Ti+Al+Si < about 52 at-%.

3. A cutting tool insert according to claim 1,
wherein said average thickness of each of said layer A ($d_A$) is about 2 nm < $d_A$ < about 25 nm;
wherein said average thickness of each of said layer B ($d_B$) is about 4 nm < $d_B$ < about 50 nm; and
wherein an average thickness of each of said layer C ($d_C$) is about 4 nm < $d_C$ < about 50 nm.

4. A cutting tool insert according to claim 1,
wherein said Me is one or more metals selected from the group consisting of Ti, Ta, Nb, and Al.

5. A cutting tool insert according to claim 1,
wherein said layer B is $(Ti_{1-x}Al_x)N$, where about 0.3 < x < about 0.95; and
wherein said layer C is $(Ti_{1-y}Si_y)N$, where about 0.04 < y < about 0.20.

6. A cutting tool insert according to claim 1,
wherein said layer B is $(Ti_{1-x}Al_x)N$, where about 0.45 < x < about 0.75; and
wherein said layer C is $(Ti_{1-y}Si_y)N$, where about 0.06 < y < about 0.12.

7. A cutting tool insert according to claim 1,
wherein said coating has been deposited with physical vapor deposition (PVD).

8. A cutting tool insert according to claim 1,
wherein said coating has been deposited with cathodic arc evaporation.

9. A cutting tool insert according to claim 1,
wherein said substrate is optionally coated with an inner single- or multilayer coating of at least one material selected from the group consisting of TiN, TiC, Ti(C,N), and (Ti,Al)N; and
wherein said substrate is optionally coated with an outer single- or multilayer coating of at least one material selected from the group consisting of TiN, TiC, Ti(C,N), and (Ti,Al)N.

10. A cutting tool insert according to claim 9,
wherein said substrate is coated with an inner single- or multilayer coating of (Ti,Al)N.

11. A cutting tool insert according to claim 9,
wherein said substrate is coated with an outer single- or multilayer coating of (Ti,Al)N.

12. A cutting tool insert according to claim 9,
wherein the total coating thickness of said inner coating, said outer coating, and
said laminar polycrystalline metal nitride layers is about 0.5 µm to about 20 µm.

13. A cutting tool insert according to claim 9,
wherein the total coating thickness of said inner coating, said outer coating, and said laminar polycrystalline metal nitride layers is about 1 µm to about 10 µm.

14. A cutting tool insert, comprising:
a substrate selected from the group consisting of cemented carbide, cermet, ceramics, cubic boron nitride based material, and high speed steel; and
a hard and wear-resistant coating comprising laminar polycrystalline metal nitrides layers;
wherein said laminar polycrystalline metal nitrides layers have a repetitive form
... A/B/A/C/A/B/A/C/ ... with a total thickness of about 0.5 µm to about 5 µm;
wherein layer A is a cubic structured TiN
wherein layer B is a cubic structured (Ti,Al)N; and
wherein layer C is a cubic structured (Ti,Si)N;
wherein the average composition of said laminar polycrystalline metal nitride layers is about 46 atomic share (at-%) < Zr+Hf+V+Cr+Nb+Ta+Ti+Al+Si < about 54 at-% and balance N;
wherein an average thickness of each of said layer A ($d_A$) is about 2 nm < $d_A$ < about 100 nm;
wherein an average thickness of each of said layer B ($d_B$) is about 4 nm < $d_B$ < about 150 nm; and
wherein an average thickness of each of said layer C ($d_C$) is about 4 nm < $d_C$ < about 150 nm; and
wherein said average thickness of each of said layer A, said layer B, and layer C is substantially constant throughout said coating.

15. A cutting tool insert according to claim 14, wherein layer B is cubic structured $(Ti_{0.34}Al_{0.66})N$.

16. A cutting tool insert according to claim 14, wherein layer C is cubic structured $(Ti_{0.91}Si_{0.09})N$.

17. A cutting tool insert according to claim 14,
wherein said coating has been deposited with cathodic arc evaporation.

18. A cutting tool insert according to claim 14,
wherein said average thickness of each of said layer A ($d_A$) is about 2 nm < $d_A$ < about 25 nm;
wherein said average thickness of each of said layer B ($d_B$) is about 4 nm < $d_B$ < about 50 nm; and
wherein an average thickness of each of said layer C ($d_C$) is about 4 nm < $d_C$ < about 50 nm.

19. A cutting tool insert according to claim 14,
wherein said substrate is optionally coated with an inner single- or multilayer coating of at least one material selected from the group consisting of TiN, TiC, Ti(C,N), and (Ti,Al)N; and
wherein said substrate is optionally coated with an outer single- or multilayer coating of at least one material selected from the group consisting of TiN, TiC, Ti(C,N), and (Ti,Al)N.

20. A cutting tool insert according to claim 19,
wherein said substrate is coated with an inner single- or multilayer coating of (Ti,Al)N, and said substrate is coated with an outer single- or multilayer coating of (Ti,Al)N.

* * * * *